United States Patent [19]

Fettweis

[11] 4,356,464

[45] Oct. 26, 1982

[54] FILTER FOR ELECTRIC SIGNALS CONSISTING OF SWITCHES, CAPACITORS AND AMPLIFIERS

[75] Inventor: Alfred Fettweis, Bochum, Fed. Rep. of Germany

[73] Assignee: Siemens Aktiengesellschaft, Berlin & Munich, Fed. Rep. of Germany

[21] Appl. No.: 196,554

[22] PCT Filed: Aug. 21, 1979

[86] PCT No.: PCT/EP79/00064

§ 371 Date: May 15, 1980

§ 102(e) Date: May 15, 1980

[87] PCT Pub. No.: WO80/00644

PCT Pub. Date: Apr. 3, 1980

[30] Foreign Application Priority Data

Sep. 15, 1978 [DE] Fed. Rep. of Germany ....... 2840346

[51] Int. Cl.$^3$ .................... H03H 19/00; H03K 5/153
[52] U.S. Cl. ..................................... 333/173; 328/151
[58] Field of Search ...................... 333/173, 174, 167; 328/167, 151; 307/523; 364/724

[56] References Cited

PUBLICATIONS

Fettweis–"Pulse Impedances and Pulse Impedance Matrices," AEÜ Band 24, 1970, Heft 11; pp. 506–512.
Fettweis–"Realization of General Network Functions," AEÜ Band 25, 1971, Heft 6; pp. 295–203.
Biorci–"Network and Switching Theory," Academic Press, New York and London, 1968; pp. 382–446.
Fettweis–"Basic Principles of Switched Capacitor Filters Using Voltage Inverter Switches", AEÜ, vol. 33, No. 1, Jan. 1979; pp. 13–19.
Fettweis–"Switched Capacitor Filters Using Voltage Inverter Switches," AEÜ, vol. 33, No. 3, Mar. 1979; pp. 107–114.
Weinrichter–"Kondensator-Kommutator-Netzwerke," AEÜ, vol. 26, No. 7/8, Jul./Aug. 1972; pp. 293–305.
Fettweis–"On the Theory of Periodically Reverse-Swithed Capacitor Networks," AEÜ, vol. 24, No. 12, Dec. 1960, pp. 539–544.
Temes–"The Derivation of Switched Capacitor Filters from Active RE Prototypes," Electronics Letters, vol. 14, No. 12, Jun. 8, 1978; pp. 361–362.
Temes–"An Improved Switched-Capacitor Integrator," Electronics Letters, vol. 14, No. 9, 27 Apr. 1978; pp. 287–288.

*Primary Examiner*—Marvin L. Nussbaum
*Attorney, Agent, or Firm*—Hill, Van Santen, Steadman, Chiara & Simpson

[57] ABSTRACT

The invention relates to a filter for electric signals consisting of switches, capacitors and amplifiers, wherein at least one switch is designed in the manner of voltage reversal switches such that the voltage at the switch terminals, subsequent to activation of the switch, is equally great in amount, but oppositely directed relative to the voltage prior to actuation of the switch. It is the object of the invention to utilize, in such filter circuits, electronic components which are as simple as possible and to fashion their design as freely as possible. In accordance with the invention this object is achieved by virtue of the fact that the voltage connected to the switch terminals (11, 12), in a first clock pulse phase (1), is intermediately stored via a first amplifier (V1) on a capacitor ($C_s$), and, in a second clock pulse phase (2), via a second amplifier (V2), this voltage is again impressed in inverted form on the switch terminals (11, 12). (FIGS. 1, 3, 4).

11 Claims, 26 Drawing Figures

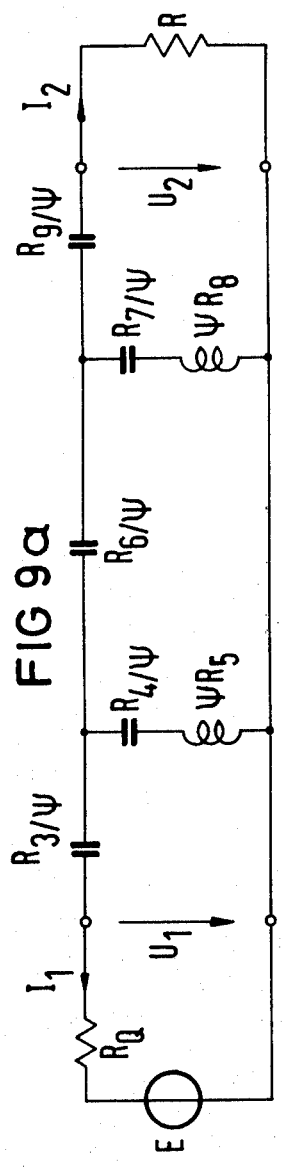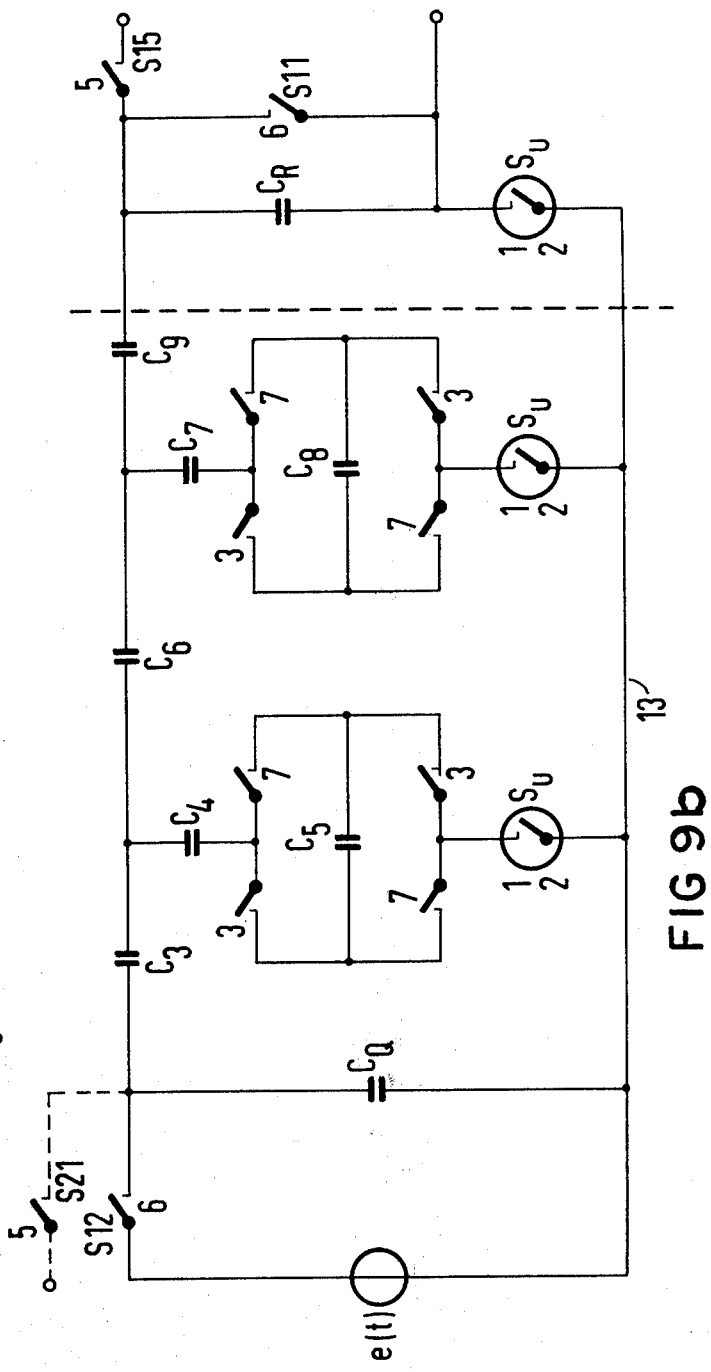
FIG 9a
FIG 9b

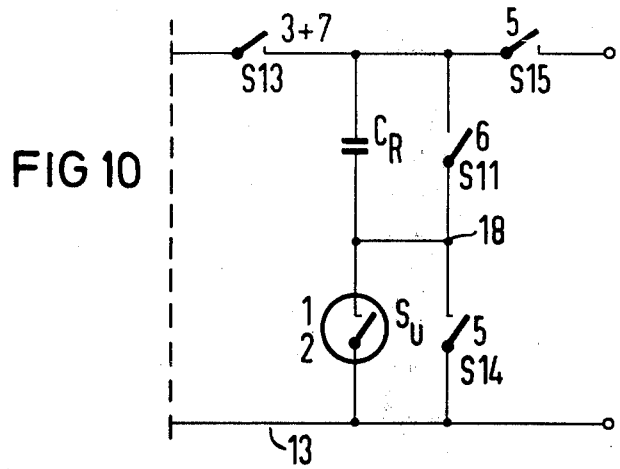
FIG 10
FIG 11
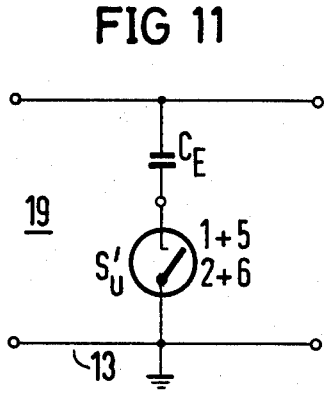
FIG 12
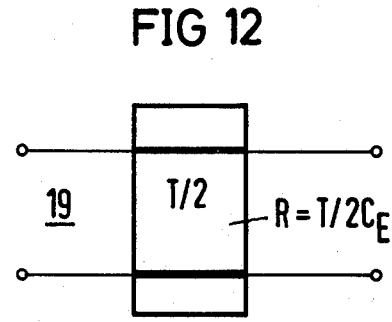
FIG 13
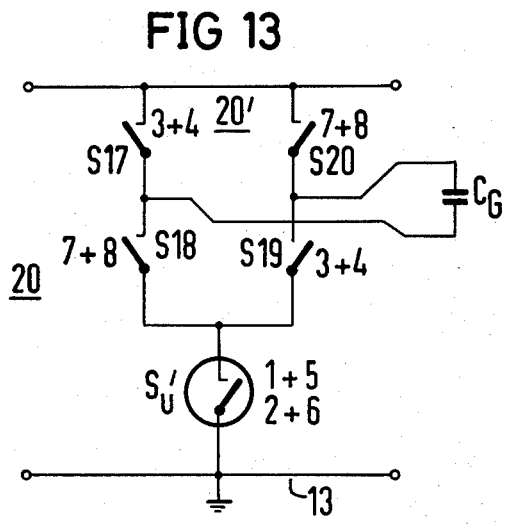
FIG 14
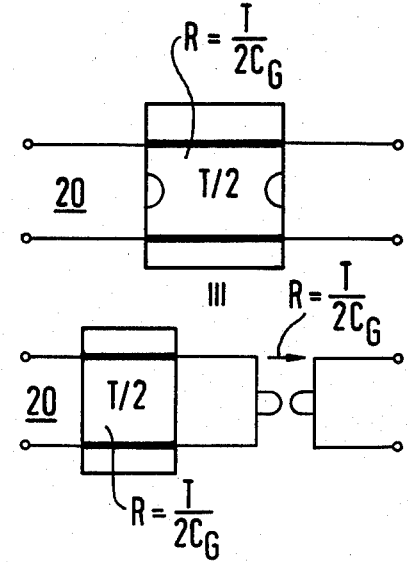

FILTER FOR ELECTRIC SIGNALS CONSISTING OF SWITCHES, CAPACITORS AND AMPLIFIERS

The invention relates to a filter for electric oscillations consisting of switches, capacitors and amplifiers, whereby at least one switch is designed in the manner of voltage reversal switches such that the voltage at the switch terminals, subsequent to actuation of the switch, is equally great in amount, but oppositely directed in relation to the voltage prior to actuation of the switch.

Switch filters of the above cited type have already become known per se. A special type of such switch filters are the so-called resonant transfer filters which are e.g. described in the journal "AEU," Vol. 24 (1970), Pages 506 through 512, as well as Vol. 25 (1971), Pages 295 through 303, and, above all, in the book "Network and Switching Theory" (edited by G. Biorci) and described therein under the sub-title "Theory of Resonant-Transfer-Circuits," pages 382 through 446, Academic Press, New York 1968. The practical realization of such filters, however, is dependent, to a not inconsiderable degree, upon the available technology, particularly if it is important to manufacture such filters with properties capable of good reproduction on a larger scale in terms of production engineering.

The object underlying the invention consists in disclosing filter circuits of this type in which comparatively simple electronic components can be utilized, and simultaneously the individual filter circuit, already in its theoretical design, is not subject to any type of restriction whatsoever regarding the operational behavior or the position of the attenuation poles.

In accordance with the invention, this object is achieved for the filters cited in the introduction by virtue of the fact that the voltage connected to the switch terminals, in a first clock pulse phase, is intermediately stored on a capacitor via a first amplifier and, in a second clock pulse phase via a second amplifier, the latter voltage is again impressed on the switch terminals in inverted form.

An additional advantageous solution can be seen in accordance with the invention in that, in a first clock pulse phase, the switch terminals are brought to the same potential, and the charge thus flowing via these terminals is intermediately stored in a capacitor, and that the capacitor is subsequently discharged in a second clock pulse phase, and that this charge is conducted in the same direction as in the first clock pulse phase via the switch terminals. Advantageous embodiments are also disclosed in the sub-claims.

On the basis of sample embodiments, the invention shall be further explained below.

IN THE DRAWING

FIG. 9A illustrates the equivalent circuit for a high pass filter;

FIG. 9B illustrates a schematic circuit diagram for the high pass filter of FIG. 9A;

FIG. 10 illustrates a circuit section with the aid of which circuits of the type of FIG. 9 can again be connected to reference potential;

FIG. 11 illustrates a circuit possibility for simulating a unit element;

FIG. 12 illustrates the electric equivalent circuit diagram pertaining to the circuit of FIG. 11;

FIG. 13 illustrates a circuit possibility for simulating a gyro unit element;

FIG. 14 illustrates the electric equivalent circuit diagram pertaining to FIG. 13;

Filters of the type cited in the introduction are, as is known, such filters which do not process analog signals in the actual sense (i.e. continuous analog signals), but such signals which are present in the form of samples, whereby the samples are generated in the rhythm of a clock pulse frequency F, and, via the relation $T=1/F$, T is correspondingly called the clock pulse period. Circuits for generating such samples are known per se, so that they need not be explained in detail at this point; however, it must be assumed in the following that such sampling circuits can be preconnected, or output-connected, respectively, to the individual circuits, so that it is thus possible to supply sample taken from a continuous analog signal to the illustrated circuits, on the one hand, and to again convert the signals available at the output of the filter circuit into continuous analog signals, on the other hand. In the case of the invention, one proceeds from the recognition that a major element of such filters are so-called voltage reversal switches in the realization of which use is made of the technological possibilities now available. Only comparatively few critical electronic modules such as, for example, operational amplifiers are here required. Moreover, it is evident that, with regard to the theoretical bases, the filter design is closed in itself and is subject to no restrictions whatsoever regarding the operating rate (sampling rate)

or the position of the attenuation poles, and that only the Nyquist theorem must be observed.

Figure 1:
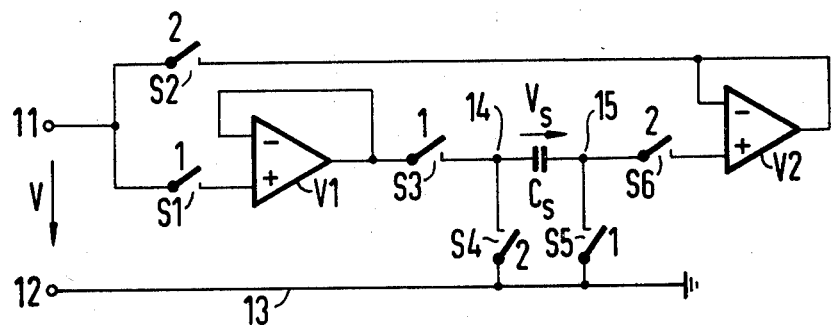
FIG. 1 illustrates a first possibility for realizing a voltage reversal switch.

In the case of the voltage reversal switch illustrated in FIG. 1, it is possible to connect one of the two switch terminals 11 and 12; namely, the switch terminal 12, to reference potential 13, as is rendered recognizable by the illustrated ground symbol. The circuit contains two operational amplifiers V1 and V2 which act as amplifiers with the amplification factor +1 because their inverting input-referenced in the circuit with "−"—is directly connected to the output. In the circuit, it can furthermore be seen that the non-inverting inputs are referenced with "+," as also applies to later embodiments. The input terminal 11, not connected to reference potential, is now connected via a first switch S1 to the non-inverting input of the amplifier V1. Following the output of the amplifier there is a switch S3 via which a circuit node 14 is reached. From this node, a capacitor $C_s$ leads to an additional circuit node 15 from which, via a switch S6, the non-inverting input of the amplifier V2 is reached. In the transverse branch of the circuit, the switches S4, or S5, respectively, can be recognized which lead from the circuit node 14, or from the circuit node 15, respectively, to reference potential 13. In the circuit it can be further recognized that the output of the second amplifier V2 is connected via the switch S2 to the input terminal 11.

Figure 2:
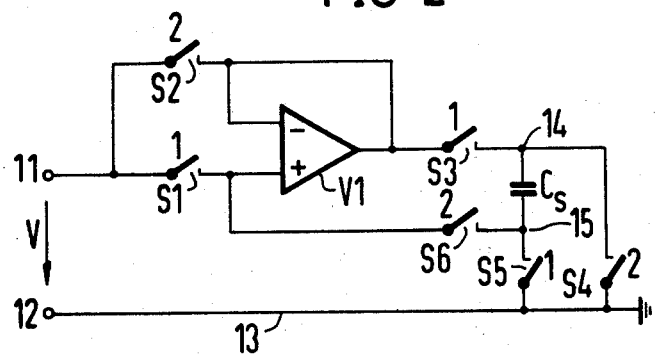
FIG. 2 illustrates an additional possibility for realizing a voltage reversal switch with only one amplifier element.

The circuit illustrated in FIG. 2 makes it possible to realize the voltage reversal switch with only one amplifier element V1 of the amplification +1. Elements having the same function are referenced with the same reference numbers as in FIG. 1, so that a direct comparison between FIGS. 1 and 2 is possible. Also in the circuit of FIG. 2, the input terminal 11 leads via the switch S1 to the non-inverting input of the amplifier V1. The output of the amplifier is connected via the switch S3 to the circuit node 14, from which the circuit node 15 is reached via the capacitor $C_s$. From the circuit node 14, the switch S4 again leads to reference potential, and, from the circuit node 15, the switch S5 likewise leads to reference potential. Deviating from FIG. 1, in the circuit of FIG. 2, the switching node 15 is connected via the switch S6 to the non-inverting input of the amplifier V1; also, the output of the amplifier V1 is connected via the switch S2 to the input terminal 11. The second input terminal 12 of the voltage reversal switch is again connected to reference potential 13. In both circuits, it can be recognized that the voltage $V_s$ occurs at the capacitor $C_s$ if the voltage V is connected to the input.

Figure 3:
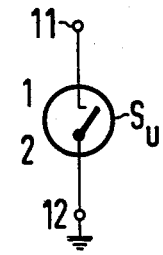
FIG. 3 illustrates the electric equivalent circuit diagram of a voltage reversal switch in the form of a switching symbol which is utilized in the following.

In FIG. 3, the voltage reversal switch $S_u$, shown in FIGS. 1 and 2, is symbolically represented, and, accordingly, its terminals are referenced with the reference numbers 11 and 12. In addition, the clock pulse phases 1 and 2 are directly indicated on the voltage reversal switch $S_u$, which relates to the position of the clock pulse phases yet to be discussed on the basis of FIG. 4.

Figure 4:
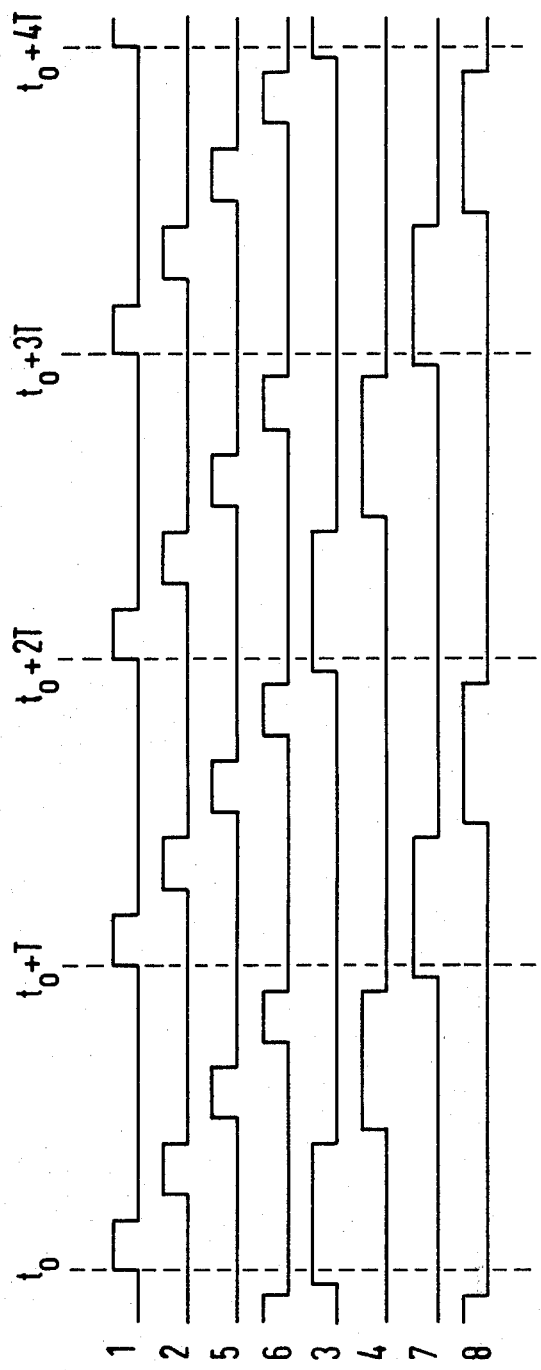
FIG. 4 illustrates a possible time-plan for the necessary clock pulse phases for circuits according to FIGS. 1 and 2 and circuits for Figures yet to follow.

In FIG. 4, the time plan for eight required clock pulse phases 1 through 8 is illustrated, of which, for the time being, only the clock pulse phases 1 and 2 are of significance for FIGS. 1 and 2. If, in addition, one compares FIGS. 1 and 2, it can be recognized that the switches S1, S3, and S5 are controlled via a first clock pulse phase 1, whereas the switches S2, S4 and S6 are controlled via a second clock pulse phase 2. Corresponding to the clock pulse plan of FIG. 4, these clock pulse phases are directly noted at the individual switches by the references 1 or 2, respectively, and the symbolic illustration of FIG. 3 is intended to additionally make recognizable that the voltage reversal switch $S_u$ is controlled by the clock pulse phases 1 and 2. FIG. 4 permits the recognition that, proceeding from a selectable time $t_o$ the clock pulse phases 1 and 2 are chronologically offset relative to one another, so that switches with the clock pulse phase 1 are already opened when switches with the clock pulse phase 2 are being closed. In FIG. 4, furthermore, the repeating conditions can be recognized in the interval of a clock pulse period T, and the respective switches are closed, i.e., electrically conductive, in those time sections, respectively, in which, in the clock pulse plan, the horizontal section extends beyond the reference line. Analogously, this also applies if clock pulse plans deviating from FIG. 4 are utilized.

In the circuits according to FIGS. 1 and 2, it is not imperative that operational amplifiers be utilized if it is merely ensured that amplifiers of a different type have the amplification +1. Generally, it can be stated that the circuits illustrated therein are sample embodiments of such circuits in which a voltage connected to the switch terminals 11 and 12, in a first clock pulse phase 1, is intermediately stored via a first amplifier V1 on a capacitor $C_s$. Subsequently, this voltage, in a second clock pulse phase, which is chronologically offset relative to this first clock pulse phase, is again impressed in inverted form on the switch terminals 11 and 12 of this switch via a second amplifier V2. Preferably, the properties of operational amplifiers will be taken advantage of, as a consequence of which it is possible, according to FIG. 2, to realize the individual voltage reversal switch with only one amplifier element.

Figure 16:
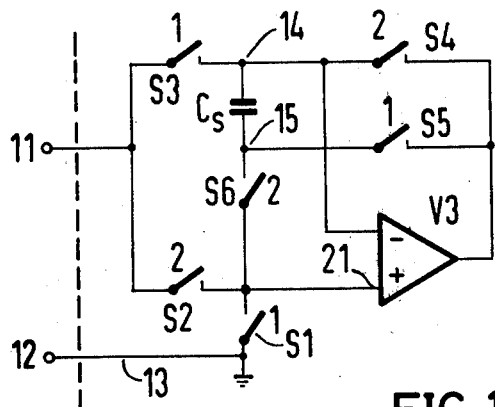
FIG. 16 illustrates an additional possibility for realizing a voltage reversal switch to which the electric equivalent circuit diagram illustrated in FIG. 3 again applies.

An additional possibility for realizing a voltage reversal switch is a charge-doubling corresponding to the principle of the inverting recharging. Reference is made in particular to FIGS. 3, 4 and 16. For this purpose, in a first clock pulse phase 1, the switch terminals 11 and 12 are brought to equal potential, and the charge thus flowing via these terminals is intermediately stored in a capacitor $C_s$. In the following, chronologically offset clock pulse phase 2, the capacitor is discharged and this charge is conducted in the same direction as in the first clock pulse phase via the switch terminals 11, 12. A possible realization form is illustrated in FIG. 16 pursuant to the utilization of an operational amplifier V3. Moreover, in FIG. 16, elements having the same function are referenced with the same reference signs as in FIGS. 1 and 2, and the controlling clock pulse phases 1 and 2 are also again directly noted at the switches. As FIG. 16 further shows, the non-inverting input 21 of the amplifier V3 leads via the switch S1 to reference potential 13 and hence to the connecting terminal 12 of the switch. From the first connection terminal 11, the non-inverting input 21 of the amplifier V3 is reached via the switch S2. The second circuit node, referenced with the reference number 15, is connected via the switch S5 to the output of the operational amplifier V3. The first circuit node referenced with 14 is like-wise connected to the output of the amplifier V3 via the switch S4. Also, the circuit node 14 can be reached from the first terminal 11 via the switch S3. Finally, the circuit node 14 is also directly connected to the inverting input of the amplifier V3. As in the circuits according to FIGS. 1 and 2, corresponding to the clock pulse scheme of FIG. 4, in the circuit of FIG. 16, the switches S1, S3 and S5 are also controlled by the first clock pulse phase, whereas the switches S2, S4 and S6 are controlled by the second clock pulse phase 2.

For the operational method, FIG. 16 shows that, during the clock pulse phase 1, the switch terminal 11 is brought to reference potential 13, since the operational amplifier V3 forces a differential input voltage approaching zero. On account of the extremely high input resistance of the operational amplifier, the charge thus flowing off via the switch terminal 11 can only be stored in the capacitor $C_S$. During the clock pulse phase 2, due to the disappearing differential input voltage of the operational amplifier V3, the discharge of the capacitor $C_s$ is forced and, due to the extremely high input resistance of V3, it is thus guaranteed that the flowing-off charge is conducted via the switch terminal 11 into the capacitor network forming the exterior wiring.

Thus, the switching symbol illustrated in FIG. 3 can also be utilized for the circuit of FIG. 16; i.e., a voltage reversal switch with the connecting terminals 11 and 12 whose individual switches are controlled by the clock pulse phases 1 and 2.

Figure 5:
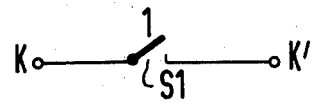
FIG. 5 illustrates a possible realization form for electronic switches such as are utilized in the invention.
Figure 5:
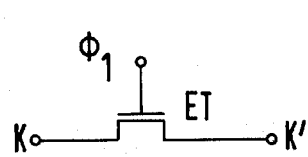
Figure 5:
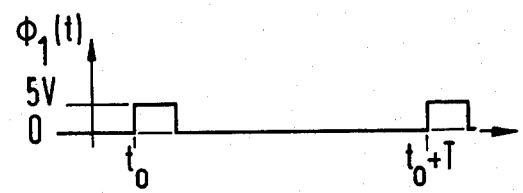

In FIG. 5, for the switch S1 with the connections K and K' controlled by the clock pulse phase 1, a possible realization form including the respective pulse plan is illustrated. For this purpose, a so-called enhancement MOS transistor ET can be utilized which becomes electrically conductive between its connections K and K' when a potential $\phi_1$ of e.g., +5 V is connected to its control electrode (gate). The construction and method of operation of such MOS transistors is known per se, so that at this point there is no need to discuss this in detail. Correspondingly to this example, also the remaining switches utilized in the circuit can, of course, be controlled via suitable clock pulse phases 1 through 8.

In the realization of filter circuits, capacitors also again appear as capacitors which are merely subjected to a modified theoretical observation method. Circuit structures deviating from the actual capacitor structure; for example, coils, signal sources, and the like, must be simulated in the realization of such switch filters by means of suitable auxiliary measures. In the following, several basic examples are indicated; i.e., examples which are suitable for rendering possible the construction of extensive filter structures according to the theory of the LC-networks.

Figure 6:
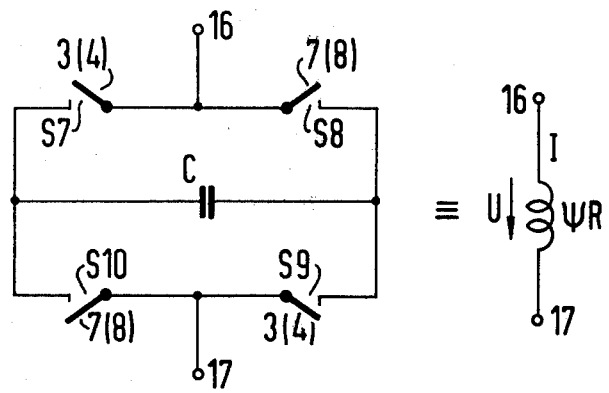
FIG. 6 illustrates a possibility for simulation of an inductance pursuant to utilization of a capacitor and electronic switches.

FIG. 6 illustrates, in its electric equivalent circuit diagram, an inductance with the connecting terminals 16 and 17, through which current I flows, and at which the voltage U drops and whose impedance is reference with $\psi$. R, whereby R=T/2C is valid. The realization possibility likewise co-illustrated in FIG. 6 is suitable to periodically reverse the poles of capacitor C. Reference is here again made to the clock pulse plan of FIG. 4, and, corresponding to the previous statements, the clock pulse phases illustrated in FIG. 4 are to be directly connected to the switches S7, S8, S9 and S10. When the conditions thus illustrated are satisfied, then the dipole, connected between the terminals 16 and 17, acts as an inductance. From FIG. 6, it can be recognized that there is connected, somewhat parallel to the capacitor C, a switching network with the switches S7 and S8, on the one hand, and S9 and S10, on the other hand. The connecting terminals 16 and 17 are connected between the switches S7 and S8, or between the switches S9 and S10, respectively. In addition, it can be recognized that the switches S7 and S9 are controlled by the clock pulse phase 3, or by the clock pulse phase 4, respectively. The switches S8 and S10 are controlled by the clock pulse phase 7, or by the clock pulse phase 8, respectively. The position of the clock pulse phases 3, 4 and 7, 8 need, for the time being, only be observed relative to one another if a circuit according to FIG. 6 is to be operated solely for itself alone. As can be recognized from the time plan of FIG. 4, the clock pulse phases 3, 4, 7, 8 are also offset relative to one another such that their switching times do not overlap. If the circuit according to FIG. 6 is utilized in a filter, then it must be additionally observed that the switches controlled with a clock pulse phase 3 are closed when, at the same time, also the switches controlled by the clock pulse phases 1 and 2 are closed. This operation is repeated periodically with period T. In the time $t_o+T$, switches which are controlled by the clock pulse phase 7 are already closed, and their closing duration in turn extends over the closing duration of the switches 1 and 2, which likewise is periodically repeated in the interval T. This correspondingly applies to the clock pulse phases 4 and 8 with the previously mentioned chronological displacement.

The switches S7 through S10 are thus not voltage reversal switches in the sense of FIGS. 1, 2 and 16, but simple switches which can likewise be realized with the transistor circuit shown in FIG. 5.

Figure 7:
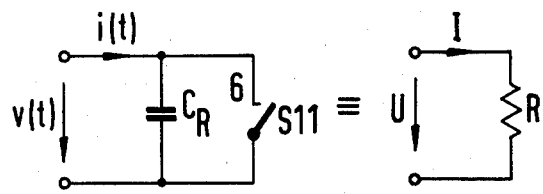
FIG. 7 illustrates a possibility for simulating an ohmic resistance.
Figure 8:
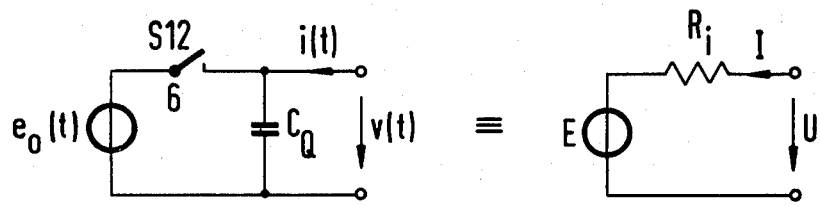
FIG. 8 illustrates a possibility for simulating a signal source with an inner resistance.

Additional switching elements suitable for use in switch filters are illustrated in FIGS. 7 and 8 in conjunction with FIG. 4.

FIG. 7 illustrates a capacitor $C_R$ which is short-circuited via an auxiliary switch S11 between two successive pulses of i(t). In the co-illustrated circuit diagram equivalent to this, there is a resistance R, to which the voltage U is connected and through which current I flows. At the switch S11, the clock pulse phase 6 is again indicated, which, according to the clock pulse plan of FIG. 4, must be so disposed at the circuit of FIG. 7, in case of utilization in a more extensive filter circuit, must be so controlled that the switch S11 is closed only in the time interval between the clock pulse phase 2 and the following clock pulse phase 1 at the time $t_o+T$. This operation is repeated periodically with period T. Circuits according to FIG. 7 can be utilized in more extensive filter circuits e.g., as a terminating impedance.

The circuit according to FIG. 8 is suited, according to its equivalent circuit diagram, for the purpose of simulating a voltage source E with the inner resistance $R_i$, which, in case of occurrence of the current I, delivers a voltage U at the output. An ideal signal source $e_o(t)$ is connected via a switch S12 to a capacitor $C_Q$. At the output of the circuit a voltage v(t) occurs, and the current i(t) flows. The switch S12 is controlled by the sixth clock pulse phase whose position relative to the remaining clock pulse phases is likewise represented in FIG. 4. Also, for the control of the switch S12; i.e., for the clock pulse phase 6, it is important that its chronological position proceed such that the switch S12 is closed only in the time interval between the second and the following first clock pulse phase if the circuit of FIG. 8 is to be utilized, possibly in conjunction with already described circuits, in a more extensive filter circuit which simulates an LC-filter circuit.

In FIG. 9 an interconnection of a plurality of individual circuit sections into a high-pass filter of the fifth degree is illustrated. FIG. 9a illustrates the electric equivalent circuit, pertaining to FIG. 9b, in the $\psi$-plane ($\psi$=tan h(pT/2) with p=$\sigma$+j$\omega$ as the complex frequency; c.f., AEÜ, Vol. 24, 1970, Pages 506 through 512 and Vol. 25 (1971), Pages 295 through 303), if, for the time being, the switch S21, controlled by the clock pulse phase 5, and the respective connection, illustrated in broken lines, remains out of consideration. The circuit of FIG. 9b permits the recognition of the iterative connection of a plurality of circuit sections. Thus, e.g., the signal source, which has already been discussed on the basis of FIG. 8, with the source e(t), the capacitor $C_Q$ and the switch S12, controlled by the clock pulse phase 6, is recognizable. Also, the capacitor $C_R$, simulating the terminating impedance, in conjunction with the switch S11 according to FIG. 7, is connected to the output of the circuit. The inner circuit sections consist of shunt branches whose method of operation has already been discussed on the basis of FIG. 6. The capacitors in the switch network are referenced with C5 and C8 merely for the purpose of differentiation. The coupling proceeds via capacitors C4 and C7 and successive individual members are interconnected via the capacitors C3, C6 and C9. It is characteristic for the circuit that all so-called critical independent loops are closed only via the voltage reversal switches $S_u$ controlled by the clock pulse phases 1 and 2. As "independent loops," or as "critical independent loops," respectively, such loops are designated in which, as a consequence of the switching operations between the voltage reversal operations, or the charge reversal operations, respectively, the sum of the voltages over the capacitors, which realize the individual switching elements, can vary.

The output signal is made available in the output branch via a switch S15 controlled by the clock pulse phase 5, whereby the position of the clock pulse phase can again be directly learned from FIG. 4. According thereto, the output signal must be made available in the time interval between the second and the sixth clock pulse phase.

When, at the capacitor $C_Q$, corresponding to the illustrated broken line in FIG. 9b, the reflected signal is detected via the switch S21, which is controlled by the clock pulse phase 5, a filter function is then obtained which is complementary to the high-pass; namely, a low-pass filter function, so that thus circuits according to FIG. 9b in this manner assume the character of branching filters.

As can be recognized in FIG. 9, the branch, illustrated to the right of the broken line, making available the output voltage, is connected to reference potential 13 via the voltage reversal switch $S_u$. For this reason, the actual filter output is not grounded on the one side; i.e., it is not to be connected to ground potential. For applied instances in which this is not desired, the section disposed to the right of the broken line can be replaced by a circuit according to FIG. 10.

For this purpose, an additional switch S13 is provided in the longitudinal branch, which is controlled by the previously discussed clock pulse phases 3 and 7. In addition, the connection point referenced with 18, which is disposed between the capacitor $C_R$ and the voltage reversal switch $S_u$, is connected to reference potential 13 via an additional switch S14 which is controlled by the clock pulse phase 5. In this manner, the output signal is available in grounded form via the switch S15 controlled by the clock pulse phase 5.

Through the preceding basic modules, it is also possible to realize additional basic circuit elements required for the design of filter circuits. Corresponding sample embodiments are illustrated in FIGS. 11 through 14.

The circuit of FIG. 11 is suited for the realization of a so-called unit line, for which the term "unit element" has also become conventional in technical language. The circuit 19 has the character of a two-port network in whose transverse branch a capacitor $C_E$ and a voltage reversal switch $S'_u$ are series-connected. The voltage reversal switch $S'_u$ consists of the switches S1 through S6, already explained on the basis of FIGS. 1, 2 and 16, whereby, however, the switches S1, S3 and S5 are controlled by the clock pulse phases 1 and 5 according to FIG. 4, whereas the switches S2, S4 and S6 are controlled by the clock pulse phases 2 and 6. Thus, the odd-numbered switches in the first and fifth clock pulse phase are closed, whereas the even-numbered switches in the second and sixth clock pulse phase are closed. The electric equivalent circuit diagram of a circuit 19 of FIG. 11 is represented in FIG. 12. Corresponding to the characteristic of the unit element for signals with sampling character, it has the delay T/2 and the characteristic impedance $R = T/2C_E$.

The circuit illustrated in FIG. 13 renders possible the realization of a so-called gyro unit element. The circuit 20 likewise has the character of a two-port in whose transverse branch a voltage reversal switch $S'_u$ is present which corresponds in its method of operation with that of FIG. 11. In FIG. 13, there is series-connected with the voltage reversal switch $S'_u$ a switch network 20' which consists of four switches S17 through S20, of which the switches S17 and S18 are to an extent series-connected, likewise the switches S19 and S20, whereby two of the series-connected switches, respectively, are disposed parallel to one another. A capacitor $C_G$ is connected to the connection points between the switches S17 and S18, or the switches S19 and S20, respectively. As can be further directly learned from FIG. 13, the switches S17 and S19 are to be connected in the rhythm of the clock pulse phases 3 and 4, whereas the switches S18 and S20 are to be connected in the rhythm of the clock pulse phases 7 and 8. The electric equivalent circuit diagram of the circuit of FIG. 13 can be recognized in FIG. 14 as a gyro unit element with the delay T/2 and the gyro resistance $R = T/2C_G$. Equivalent to this is an equivalent circuit diagram which consists of a non-gyro unit element with the delay T/2 and the characteristic impedance $R = T/2C_G$ to which a gyrator with the gyro resistance $R = T/2C_G$ is outlet-connected.

In the circuit diagram of FIG. 13, the switch referenced with $S'_u$ can also be replaced by a switch which was referenced in the preceding sample embodiments by $S_u$. Use will always be made of this possibility when this is necessary for the filter behavior to be realized, respectively.

Figure 15A:
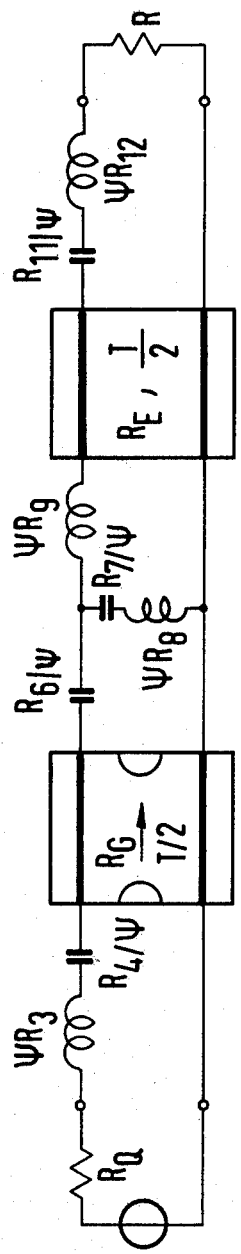
FIG. 15A illustrates an equivalent circuit of a band pass filter.
Figure 15B:
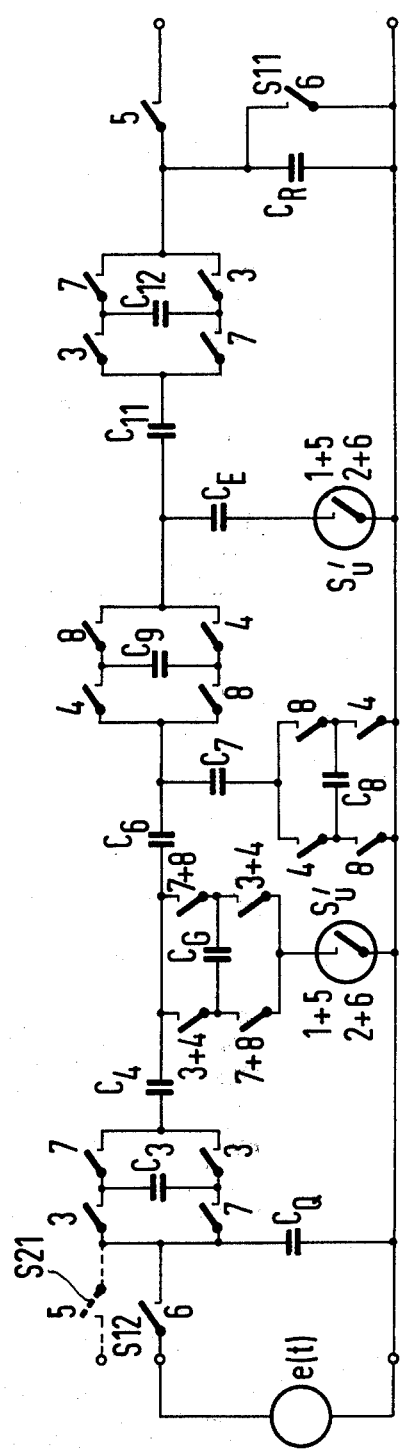
FIG. 15B illustrates a schematic diagram of the band pass filter of FIG. 15A.

As a possible example of application, a band pass circuit of the eighth degree is illustrated in FIG. 15b which delivers a doubled attenuation pole for the frequencies $\omega = 0$ and $\omega \to \infty$, respectively. This circuit also is constructed in such a manner that all critical independent loops are closed only via voltage reversal switches; thus, in the sample embodiment, via the voltage reversal switches $S'_u$. As is immediately apparent from a comparison with the preceding Figures, the individual circuit sections have already been discussed in detail. In the longitudinal branches of the circuit there are additional circuit sections which proceed directly from FIG. 6. The coupling of successive longitudinal branches proceeds in each instance via the capacitors C4, C6 and C11. In the center transverse branch, a circuit according to FIG. 6 is likewise coupled via a capacitor C7. The corresponding control via the clock pulse phases 1 through 8 is directly indicated on the switches. The electric equivalent circuit diagram is likewise jointly illustrated in FIG. 15a.

Corresponding to FIG. 9, the circuit illustrated in FIG. 15 also has the property of supplying the complementary filter function when, at the capacitor $C_Q$, as is indicated in broken lines, the voltage representing the reflected signal is detected via a switch S21 which is controlled by the clock pulse phase 5. Thus, in the present instance, the output following the switch S21 has the character of a band-stop filter, and use can always be made of this branching filter property when this is necessary in the specific applied instance.

On the basis of FIGS. 17 through 20, it is additionally shown that, with the aid of the voltage reversal switches illustrated in FIGS. 1, 2 and 16, circulators and hence all-pass circuits can also be realized.

Figure 17:
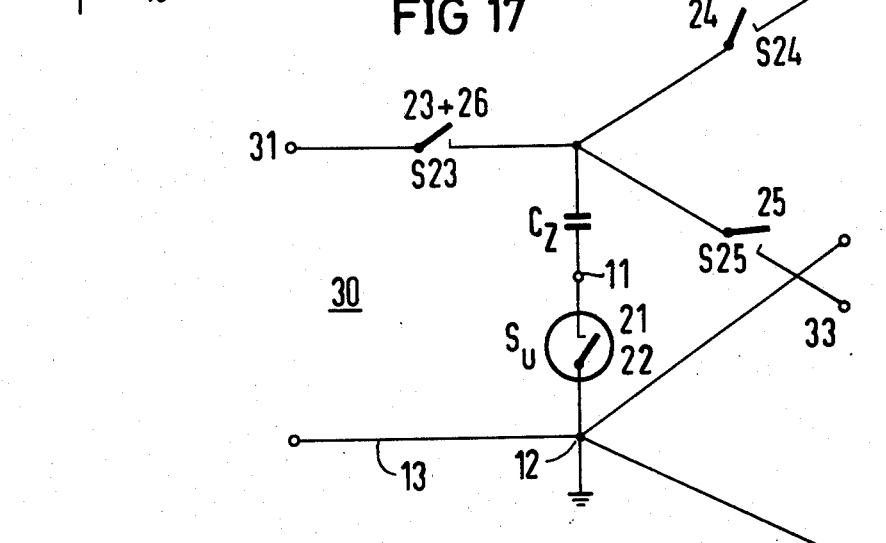
FIG. 17 illustrates a possibility for simulating a circulator.
Figure 19:
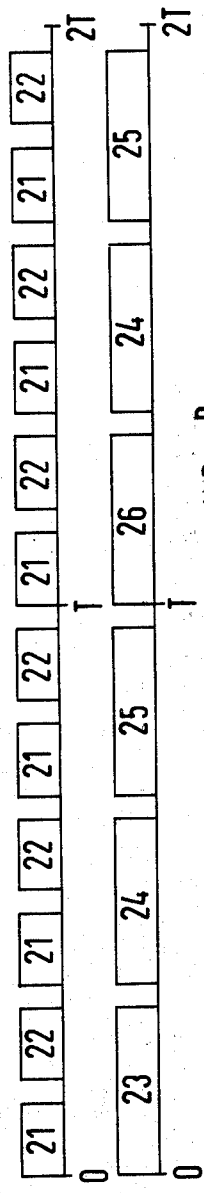
FIG. 19 illustrates an additional clock pulse plan for circuits according to FIGS. 17 and 20.

In FIG. 17, the circuit referenced with 30 is a three-port in which the line 13 is connected to reference potential, so that the ports 31, 13 or 32, 13 or 33, 13, respectively, result. The voltage reversal switch $S_u$ with the connecting terminals 11 and 12 is disposed approximately between the branching points, and a capacitor $C_Z$ is series-connected with it. In the longitudinal branches 31, 32 and 33, leading to the connecting terminals, the switches S23, S24 and S25 are disposed of which the switch S23 is controlled with the clock pulse phase 23 and 26, the switch S24, with the clock pulse phase 24, and the switch S25, corresponding to the clock pulse phase 25. The voltage reversal switch $S_u$ itself is controlled by the two clock pulse phases 21 and 22. In FIG. 19, the respective clock pulse plan is illustrated; namely, over the time interval 0 to 2T, and this clock pulse plan is repeated periodically with period 2T. As can be recognized from FIG. 19, the clock pulse phases 23 through 26 each have such a length that they overlap the clock pulse phases 21 and 22. In the time interval 0 to T, the switches controlled by the clock pulse phases 23, 24, 25 are closed, and in the time interval T through 2T, the switches controlled by the clock pulse phases 26, 24 and 25 are closed.

Figure 18:
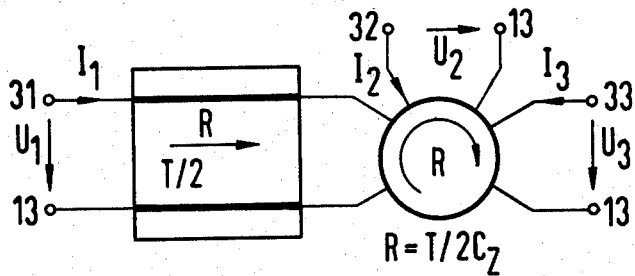
FIG. 18 illustrates the electric equivalent circuit diagram pertaining to the circuit according to FIG. 17.

The electric equivalent circuit diagram of the circuit according to FIG. 17 is illustrated in FIG. 18, whereby it can be recognized that the circulator is characterized by the resistance $R = T/2C_Z$. At the ports 31, 13 or 32, 13 or 33, 13, the voltages $U_1$ or $U_2$ or $U_3$, respectively, occur, and the currents $I_1$ or $I_2$ or $I_3$, respectively, flow into these gates, whereby a unit element with the step resistance R and the line delay T/2 follows the port 31, 13. Thus, also the circuit illustrated in FIG. 17 has the property that electric signals which are fed in at any one of the ports are emitted only at the next following port, respectively.

Figure 20A:
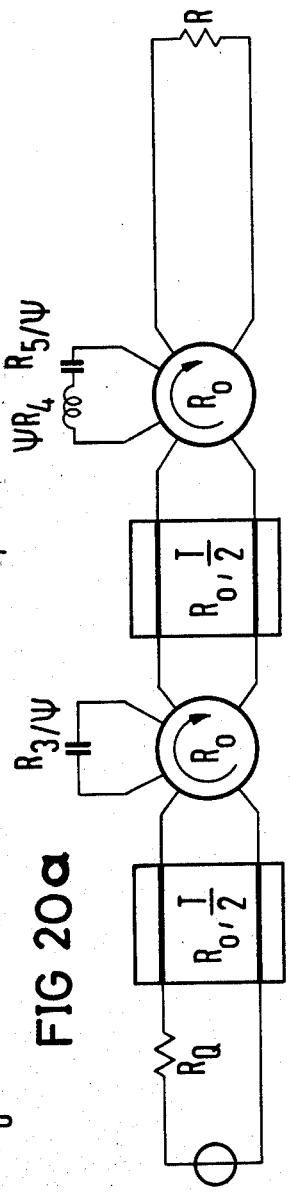
FIG. 20A illustrates an equivalent circuit diagram of an all-pass circuit.
Figure 20B:
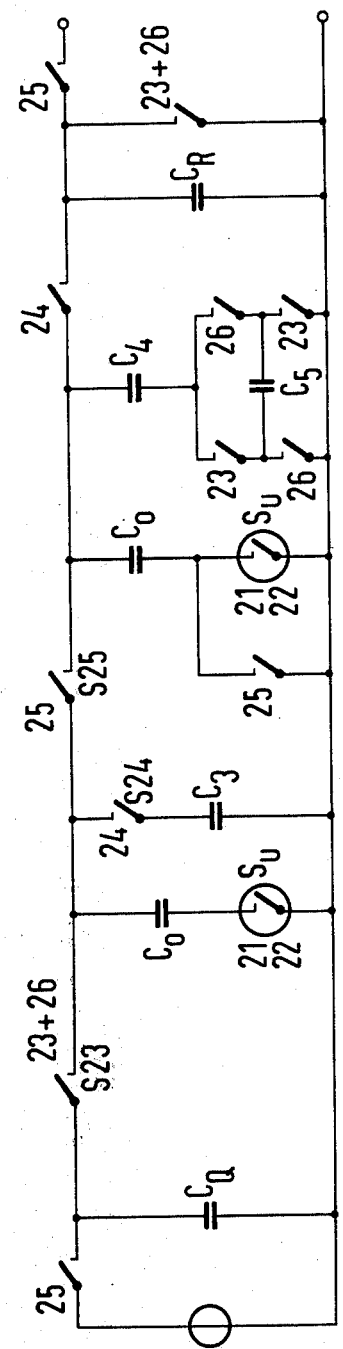
FIG. 20B illustrates a schematic diagram of the all-pass circuit of FIG. 20A.

In the Example of FIG. 20b, an all-pass circuit is additionally shown which again consists of the chain connection of circuit sections which have already been discussed per se, and which again contains voltage reversal switches $S_u$ and simple switches. In the longitudinal branches of the circuit, switches are again disposed whose closing duration is determined by the clock pulse phases 23 through 26. In the first shunt branch a voltage reversal switch $S_u$ is disposed to which a capacitor $C_o$ is series-connected. Disposed parallel hereto is a simple switch S24, controlled by the clock pulse phase 24, to which a capacitor C3 is outlet-connected in series. In the following shunt branch, an additional voltage reversal switch $S_u$ can likewise be recognized; parallel thereto, however, a simple switch is disposed which is controlled by the clock pulse phase 25. Finally, a network is disposed in an additional shunt branch which network is coupled via the capacitor C4, the method of operation of said network having already been described in principle on the basis of FIG. 6. The input networks and output networks are explained on the basis of FIGS. 7 and 8. It must merely be noted that, for the circuit of FIG. 20b, the clock pulse plan illustrated in FIG. 19 is observed.

The electric circuit diagram illustrated in FIG. 20a has likewise already been explained in its major portions. At the first circulator, the capacitor referenced with R3 corresponds to the capacitor C3 controlled via the switch S24, and, at the second circulator, the series-connection of coil and capacitance, referenced with R4 and R5, respectively, corresponds to the switch network, coupled via the capacitor C4, in connection with the capacitance C5.

Figure 21:
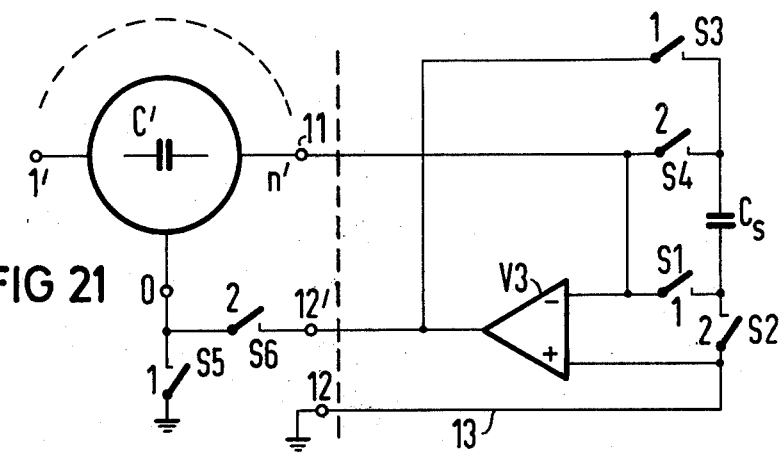
FIGS. 21 through 23 illustrate capacitor-switch networks comprising a three-pole voltage reversal switch.
Figure 22:
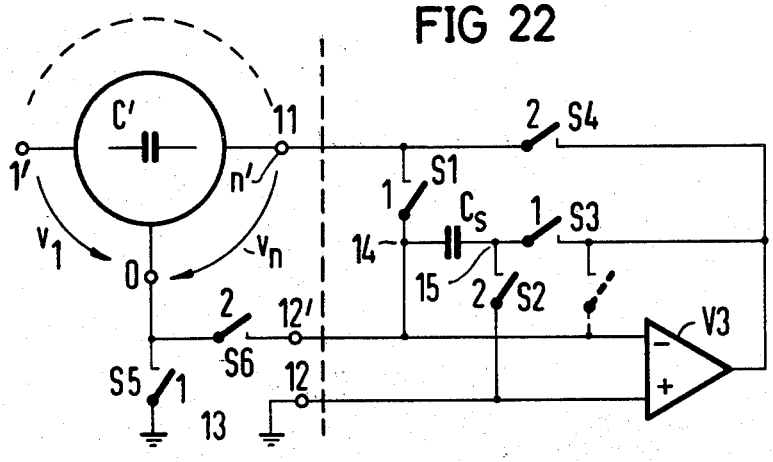

In the circuit of FIG. 16, it can be recognized that the operational amplifier V3 therein is always switched off from the reference potential 13 when the switch S1, controlled with the clock pulse phase 1, opens. If it is important—which can, for example, be the case when parasitic earth capacitances interfere to always keep the amplifier at ground potential on one side, this can be achieved by introducing additional switches which, during successive clock pulse phases 1 and 2, are alternately closed. Possible embodiments of such switches are illustrated in FIGS. 21 and 22 in which the circuit illustrated to the right of the broken line is again referenced as an inverting recharging circuit. As can be recognized therein, the individual switches are likewise controlled by clock pulse phases 1 and 2, which are again directly labeled at the switches. Precaution must be exercised to ensure that here also the clock pulse phases do not overlap, so that corresponding switch groups (e.g., clock pulse phase 2) always only close when the switches of the other group (e.g., clock pulse phase 1) are already opened. Also in these two circuits, the capacitor $C_s$, acting as intermediate store, can be recognized, which leads either directly (FIG. 22) to the inverting input of the operational amplifier V3, or the inverting input is reached via the switch controlled by the clock pulse phase 1 (FIG. 21). In every instance, the non-inverting input of the amplifier V3 is connected to reference potential 13.

Figure 23:
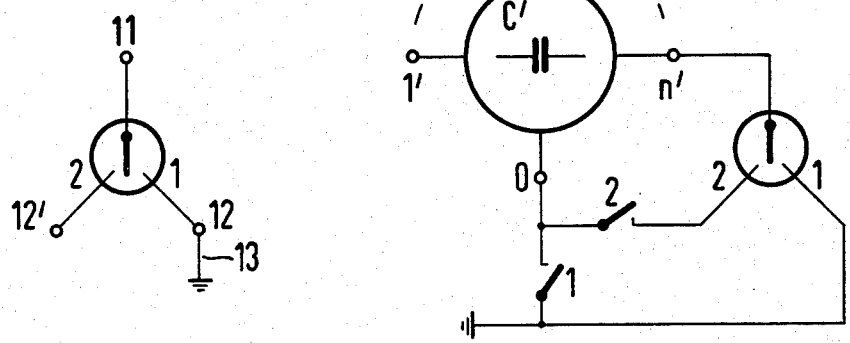

For the circuits according to FIGS. 21 and 22, a switching symbol can very generally be indicated such as is illustrated in FIG. 23. It can be recognized therefrom that the switches illustrated in FIGS. 21 and 22 function as three-pole switches by which e.g., in the clock pulse phase 1, ground potential can always be connected, whereas, in the clock pulse phase 2, additional capacitance networks of a very general type, referenced symbolically in FIG. 23 by C', can be connected. Switches according to FIGS. 21 through 23 can also be utilized in corresponding circuit types of the examples described above, whereby, however, it must be noted that the allocation of the switch clock pulse phases for the inverting recharging switches to the clock pulse phases, by which the remaining basic modules of the respective filter circuit are controlled, possibly proceeds such that the functions desired on the basis of the described sample embodiments are also satisfied when switches according to FIGS. 21 through 23 are utilized.

In case of utilization of a plurality of voltage reversal switches according to the recharging principle according to FIGS. 21 through 23 in an overall filter, the recharging operation is to be conducted sequentially in a plurality of clock pulse phases, allocated to the individual switches, respectively, through the introduction of additional clock pulse phases.

The following comments are additionally made regarding the preceding sample embodiments.

Investigations underlying the invention have shown that the resonant-transfer-filters, disclosed in the references cited in the introduction, can be so modified that they become usable for technological means available today. The major switching elements which are necessary were referred to in the preceding as voltage reversal switches. A voltage reversal switch can be constructed comparatively simply with the aid of operational amplifiers and conventional switches. In the following, the fundamental principles of these switch capacitance filters with voltage reversal switches are to be additionally presented.

The disclosed method opens a series of simple possibilities of simulating loss-free ladder networks which are operated between ohmic terminating impedances. The corresponding filters thus enjoy the excellent properties regarding the attenuation possibility which filters of such structures have. The design theory contains no assumptions regarding the sampling(operating) rate; i.e., the sampling rate can be so low as is compatible with the Nyquist-Theorem. Transmission-zero positions (attenuation poles) can be connected to arbitrary frequency positions in the stop band. These properties, together with the fact that only capacitance ratios are of significance, that the number of critical, electronic elements (for example, operational amplifiers) is substantially lower than for other design methods, and that, in addition, the entire circuit arrangement is comparatively simple, render the filters described herein entirely accessible also for construction in integrated technology. In the practical realization, it is possible to always connect the voltage reversal switches on one side to reference potential; for example, ground potential.

The following applies to the grounded voltage reversal switches. An $(n'+1')$-network of e.g., FIG. 22 is considered, of which it is assumed that it consists exclusively of capacitances (referenced comprehensively with C'). Its terminals are referenced with the continuous numbers $\nu=0.1', \ldots n'$, the reference terminal is $\nu=0$, the terminals $2'$ through $n'-1$ are indicated in broken lines. It is assumed that, in a predetermined time, charges are present on the capacitances; the resulting values of the voltages v are to be referenced with $v_{\nu b}$ (b=before). The every terminal $\nu, \nu = 1'$ through $n'$, a charge $q_\nu$ is sent, a new value of the voltages $v_\nu$, resulting therefrom, are to be referenced with $v_{\nu a}$ (a=after). In particular, one is interested in obtaining the following:

$$v_{\nu a} = -v_{\nu b}, \nu = 1' \text{ bis } n'. \tag{1}$$

Arrangements which satisfy these conditions are designated as voltage reversal switches.

A comparatively simple, rapid method for realizing a grounded voltage reversal switch is shown in FIG. 1. Two operational amplifiers V1, V2 are utilized which are connected as voltage followers. During a first time interval, the switches referenced with 1 are closed, whereas the switches referenced with 2 are open. The voltage $v_s$ via the storage capacitance $C_s$ then becomes equal to the voltage at the terminal 11 with reference to ground potential, i.e, terminal 12. After the switches 1 are again opened, the switches 2 are closed. Accordingly, the voltage, which then appears between terminals 11 and 12, is the negative voltage in relation to the voltage originally present between these terminals.

It is important that, between the time intervals in which the switches 1 and 2 are each closed, no overlapping occurs; i.e., that the switches 1 are open before the switches 2 begin to close, and conversely. It follows therefrom, in particular, that the two operational amplifiers in the circuit of FIG. 1 are never simultaneously active. Accordingly, the voltage reversal effect can also be achieved with a circuit according to FIG. 2 which requires only one operational amplifier and in which the switches operate in the manner just discussed.

The circuits according to FIGS. 1 and 2 are not the only examples for realizing grounded voltage reversal switches. In particular, it is not necessary to always represent all details, and, accordingly, a voltage reversal switch can be represented by the symbol illustrated in FIG. 3 (the ground connection is rendered recognizable and the numbers 1 and 2 have the same significance as in FIGS. 1 and 2). It is said that the switch operates when it executes the process of the voltage reversal. The operating period thus extends from the time from which the switches 1 begin to close until the time at which the switches 2 are completely open. Additional capacitance networks with a plurality of terminals, in the case of which voltage reversal switches simultaneously operate, are shown above for additional examples.

The reader familiar with resonant-transfer-circuits recognizes therefrom that voltage reversal switch brings about the same overall effect as a resonant-transfer-switch. Therefore, the circuits according to FIGS. 1 and 2 can be construed as electronic realizations of a grounded resonant-transfer-switch.

In detail, the disclosed circuits have the following properties.

The present circuits, through suitable interpretation, can be considered as circuits in which signals present in the form of samples are processed. A significant point in the present theory can be seen in finding, for these circuits, suitable equivalent circuits which are known per se. In order to achieve this, a suitable frequency must first be established.

It is assumed that F is the operating rate of the considered circuit, T the corresponding operating period; i.e., $$F = 1/T, \Omega = 2\pi F = 2\pi/T \tag{2}$$

and p is the complex frequency of the signal. A suitable equivalent complex frequency is then the quantity $\psi$ which is defined by $$\psi = \tan h \, (pT/2) = (z-1)/(z+1), z = e^{pT} \tag{3}$$

which was also previously made the basis in the references cited in the introduction; for example, for resonant-transfer-switches.

The advantages of the transformation (2) are known. It must be recalled that the following relations are valid:

$$Re \, p > 0 <===> Re \psi > 0 \tag{4}$$

$$Re \, p = 0 <===> Re \psi = 0$$

$$Re \, p < 0 <===> Re \psi < 0,$$

that for $p = j\omega$, there results $$\psi = jp, p = \tan(\omega T/2) \qquad (5)$$

and that the Nyquist-interval $0 < \omega < \Omega/2$ (whereby $\Omega$ is defined by (2)) is transformed into the overall range $0 < p < \infty$. An important conclusion which can be drawn from (4) is that stability in the $\psi$-plane guarantees the stability in the p-plane.

In the following, it is necessary to discuss pulse currents; i.e., currents $i = i(t)$ which consist of a pulse train. It must be stipulated of the individual pulses that they occur during periodically repeating intervals. However, no assumptions regarding the pulse width need be made, with the exception being that the pulses cannot be permitted to overlap; above all, the pulse width, in no case, need be short in relation to T.

The $n^{th}$ pulse is assumed to occur at a time $t_n$ located inside of the pulse width and given by $$t_n = t_0 + nT, n = \ldots -1, 0, 1, 2, \ldots, \qquad (6)$$

whereby $t_o$ is a constant (FIG. 4). The entire charge which is transported by the $n^{th}$ pulse is to be referenced with $q(t_n)$.

It is pointed out that it would be entirely sufficient for the following explanations to select $t_o = 0$; however, the results will not be touched if $t_o \neq 0$.

The following considerations apply to the fundamental elements. Let it be assumed that a capacitance C is observed into which the pulse current $i = i(t)$ flows and which is of the above discussed form. $v = v(t)$ is to be the voltage over this capacitance C.

One is particularly interested in the voltages $v_b$ and $v_a$ which, as values of v, are defined just before pulse commencement and just after pulse completion. These voltages are related to the time $t_n$ which corresponds to the pulse considered, respectively. Accordingly, more precisely, $v_b = v_b(t_n)$ and $v_a = v_a(t_o)$ can be written. The equations $$v_a(t_n) - v_b(t_n) = q(t_n)/C \qquad (7)$$

and $$v_b(t_{n+1}) = v_a(t_n) \qquad (8)$$

are obviously valid. Further, a voltage $u = u(t_n)$ is defined as follows:

$$u(t_n) = [v_a(t_n) + v_b(t_n)]/2 \qquad (9)$$

In order to express the difference equations (7) through (9) under the conditions of the steady state, the following can be written:

$$v_a(t_n) = V_a e^{pt_n}, v_b(t_n) = V_b e^{pt_n} \qquad (10)$$

$$u(t) = U e^{pt_n}, q(t_n) = Q e^{pt_n} \qquad (11)$$

whereby $V_a$, $V_b$, U and Q are complex constants. If equation (3) and the equations (6) through (9) are employed, and $V_a$ and $V_b$ are eliminated, one then finally obtains $$U = JR/\psi \qquad (12)$$

whereby J and R are defined by $$J = Q/T, R = T/2C \qquad (13)$$

Thus, if U is conceived as an equivalent voltage, and I as an equivalent current, equation (12) can be conceived as the voltage-current-dependency of a capacitance with the impedance $R/\psi$; i.e., the equation (12) corresponds to the equivalent circuit of a capacitance. It must be noted that the following relation is additionally valid:

$$U = (V_a + V_b)/2, RJ = (V_a - V_b)/2 \qquad (14)$$

$$V_a = U + RJ, V_b = U - RJ \qquad (15)$$

and that R was designated as step resistance (for which, in English technical language, the term "step resistance" is used) in the theory of the previously cited resonant-transfer-circuits.

The just-discussed capacitor C is now modified through connection of a terminal reversal switch (cf., FIG. 6), which reverses the terminals of C between two successive pulses of i(t). An inverter of this type is comparatively simple to realize through four simple switches according to FIG. 6. It is then sufficient that e.g., the switches operated with the clock pulse phase 7 (8) are open, whereas the $n^{th}$ pulse arrives when n is odd-numbered, and conversely, when n is even-numbered. The presence of the terminal reversal switch does not change (7), but it is replaced (i) by $$v_b(t_{n+1}) = -v_a(t_n).$$

If (9) through (11) and (3), (6) and (13) are again utilized, then one obtains $$U = J\psi R. \qquad (16)$$

Corresponding to this equation is the equivalent circuit of an inductance with the impedance $\psi R$, which is likewise illustrated in FIG. 6.

The circuit of FIG. 7 shows a capacitance C, which is designated therein by $C_R$ for better clarity, into which a current i(t) according to the above definition flows, and an auxiliary switch S11, which is opened when a pulse of i(t) arrives and which, however, discharges $C_R$ in every interval which separates two successive pulses. Equation (7) remains valid thereby; however, equation (8) must be replaced by $$v_b(t_n) = 0.$$

If (9) through (11) and (13) are again employed, one obtains $$U = JR. \text{ TM} \qquad (17)$$

Corresponding to this equation is the equivalent circuit of a resistance R (FIG. 7). Such a resistance can be employed in a filter as a terminating imedpance, possibly by outlet-connecting to it a voltage follower, for example.

The circuit of FIG. 8 is derived from that of FIG. 7 by connecting an ideal voltage source $e_o(t)$ in series with the switch S12. This switch is in turn open during the time in which a pulse arrives from i(t); however, it is opened in the pulse pauses. It is assumed that $t_n - T_o$, whereby $T_o$ is a constant, is the time at which S12 is opened before the pulse belonging to time $t_n$ arrives. The relation then is valid:

$$v_b(t_n) = e_o(t_n = T_o)$$

which is thus the equation by which (8) must be replaced, whereas (7) remains the same. If one again employs (9) through (11) and (13) and $e_o(t_n)=E_o e^{pt_n}$, then one obtains $$U=E+JR, E=E_o e^{-pT_o} \tag{18}$$

Corresponding to this equation is the equivalent circuit of a voltage source E in series with a resistance $R_i$ (FIG. 8). The difference between E and $E_o$ is irrelevant, since it merely corresponds to a uniform delay $T_o$. In order to obtain a voltage source whose inner resistance has nearly the value zero, it is possible in practice to make use of a voltage follower which is connected between S12 and $e_o(t)$.

It must be noted that (14) and (15) remain valid for all four circuit arrangements which have just been discussed. The equivalent circuits at which one arrives can also be utilized for calculating the average transmitted power P. Under the assumption that $p=j\omega$, it is possible to write $$U=|U|e^{j\alpha}, Q=T|J|e^{j\beta}.$$

If one takes the real component of the corresponding complex value, one then obtains $$u(t_n)=|U|\cos(t_n+\alpha), q(t_n)=T|J|\cos(\omega t_n+\beta). \tag{19}$$

On the other hand, the energy transmitted by a pulse is $$[v_a^2(t_n)-v_b^2(t_n)]C/2=u(t_n)q(t_n) \tag{20}$$

Whereby use has been made of the equations (7) and (9); i.e., relations which are valid in all instances. If one compares (19) and (20) and utilizes (6), then it is apparent, by taking the chronological mean of (20) that $$P=ReUJ^*/2=ReU^*J/2, \tag{21}$$

is valid under the condition that $\omega$ is not a multiple of $\Omega/2$ (cf. (2)).

Since equation (21) is precisely valid for conventional circuits, it is apparent therefrom that all other classic results which are derived from these relations likewise have validity. For example, the mean power which is taken up by a resistance R (FIG. 7) is given by $|J|^2 R/2$, and the maximum power which can be taken from a source according to FIG. 8 is $$|E|^2/8R_i=|E_o|^2/8R_i.$$

The above considerations, in a corresponding application of the theoretical relations, known per se from the cited references, can also be made the basis for the realization of the additionally discussed circuits which are merely to be regarded as examples of a plurality of possible realization structures.

I claim:

1. In an electric filter comprised of switches, capacitors, and amplifiers, the combination comprising:
   at least one voltage reversal switch operating to produce a voltage at first and second switch terminals, subsequent to actuation of the voltage reversal switch, which is equal in magnitude but of opposite polarity to the voltage at such terminals prior to actuation of the voltage reversal switch, said voltage reversal switch comprising:
   a capacitor for storing the voltage presented thereto during a first clock pulse phase;
   means for connecting said first switch terminal to a reference potential;
   amplifying means;
   first connecting means including said amplifying means and a first switch operated during a first clock pulse phase for connecting said second terminal to said capacitor;
   second connecting means including said amplifying means and a second switch operated during a second clock pulse phase for connecting said capacitor to said second terminal;
   said first connection means including a third switch operated during the first clock pulse phase and connected in series with said first switch;
   a fourth switch operated during the second clock pulse phase and connected between one end of said capacitor and said reference potential;
   a fifth switch operated during the first clock pulse phase and connected between the other end of said capacitor and said reference potential; and
   said second connection means including a sixth switch operated during the second clock pulse phase and connected in series with said second switch.

2. Apparatus according to claim 1, wherein said amplifying means comprises first and second amplifiers, each of said amplifiers having unity gain;
   means connecting said first amplifier in series between said first and third switches, and means connecting said second amplifier in series between said sixth and second switches.

3. Apparatus according to claim 1, wherein said amplifying means comprises a single unity gain amplifier;
   means connecting said amplifier in series with said first and third switches, with the input of said amplifier being connected to the first switch and the output of said amplifier being connected to the third switch, to establish a series path through said first and third switches from said second terminal to said capacitor during said first clock pulse phase; and
   means connecting said amplifier in series with said sixth and second switches, with the input of said amplifier connected to the sixth switch and the output of said amplifier connected to the second switch, for establishing a series path from said capacitor to said second terminal during said second clock pulse phase.

4. In an electric filter comprised of switches, capacitors, and amplifiers, the combination comprising:
   at least one voltage reversal switch operating to produce a voltage at first and second switch terminals, subsequent to actuation of the voltage reversal switch, which is equal in magnitude but of opposite polarity to the voltage at such terminals prior to actuation of the voltage reversal switch, said voltage reversal switch comprising;
   a capacitor for storing the voltage presented thereto during a first clock pulse phase;
   amplifying means;
   first connecting means including said amplifying means and a first switch operated during a first clock pulse phase for connecting said second terminal to said capacitor;
   second connecting means including said amplifying means and a second switch operated during a second clock pulse phase for connecting said capacitor to said second terminal;

said first connection means including a third switch operated during the first clock pulse phase and connected in series with said first switch;

a fourth switch operated during the second clock pulse phase and connected between one end of said capacitor and said amplifying means;

a fifth switch operated during the first clock pulse phase and connected between said amplifying means and said reference potential; and a sixth switch operating during the second clock pulse phase and connected between said amplifying means and said capacitor.

5. Apparatus according to claim 4, wherein:

said amplifier comprises an operational amplifier having an inverting input and a non-inverting input;

said fifth switch is connected between said non-inverting input and a reference potential;

said second switch is connected between said second terminals and said non-inverting input;

said sixth switch is connected between a first terminal of said capacitor, to which said first switch is connected, said capacitor and the output of said amplifier;

said third switch is connected between the output of said amplifier and the second terminal of said capacitor; and said fourth switch is connected between second terminal of said capacitor and said non-inverting input of said amplifier.

6. In an electrical filter apparatus according to claim 1, a circuit for realizing an inductance between two inductance terminals comprising:

a second capacitor; and a switch network consisting of four switches, individually connecting each terminal of said second capacitor to each of said inductance terminals, each of said switches being operated during one of two non-overlapping clock pulse phases, whereby said capacitor is connected to said inductance terminals with opposite polarity during the two said clock pulse phases.

7. In an electrical filter apparatus according to claim 1:

a circuit realizing a resistance between two resistance terminals comprising a second capacitor; and a switch connected in parallel with said second capacitor and operated during a predetermined clock pulse phase, whereby the switch is closed between voltage reversal operations of said voltage reversal switch.

8. In an electrical filter apparatus according to claim 1, a circuit for realizing a signal source with a specified internal resistance between two source terminals comprising:

a second capacitor connected across said source terminals;

a signal source acting as a voltage source; and a switch operated during a predetermined clock pulse phase connecting said signal source with said second capacitor, said switch being closed only during the time interval between the first and second clock pulse phases.

9. Electrical filter apparatus according to claim 1, wherein said filter apparatus has a plurality of interconnected circuit sections, and an output section connected to the last of said interconnected circuit sections;

said output section including a branch circuit means connected through an output voltage reversal switch to a reference potential;

a seventh switch operated during third and fifth different predetermined clock pulse phases for connecting said output section to said last interconnected circuit section of said filter;

an eighth switch operated during a fourth clock pulse phase connecting said output voltage reversal switch to a reference potential; and a ninth switch operated during the fourth clock pulse phase for connecting said branch circuit means to an output terminal, whereby said ninth switch is closed between operation of said output voltage reversal switch.

10. In an electrical filter according to claim 1, a circuit for realizing a circulator circuit having three ports, comprising:

a transverse branch including a capacitor and a voltage reversal switch connected in series, said voltage reversal switch being operated during a first clock pulse phase and a second clock pulse phase;

a seventh switch operated during a third and a sixth clock pulse phase being connected between said branch and a first port;

an eighth switch operated during a fourth clock pulse phase connected between said branch and a second port;

a ninth switch operated during a fifth clock pulse phase connected between said branch and a third port; and whereby only one of the three switches connected to said branch is operated at any one time.

11. In an electric filter comprised of switches, capacitors and amplifiers, the combination comprising:

at least one three-pole voltage reversal switch operating to produce a voltage at first and second switch terminals, subsequent to actuation of the voltage reversal switch, which is equal in magnitude but of opposite polarity to the voltage at such terminals prior to actuation of the voltage reversal switch, said voltage reversal switch comprising:

a capacitor for storing the voltage presented thereto during a first clock pulse phase;

an operational amplifier having inverting and non-inverting input terminals;

means for connecting a third terminal of said three-pole switch to a reference potential and to said non-inverting input;

a first switch operated during a first clock pulse phase for connecting said second terminal and said non-inverting input to said capacitor;

a second switch operated during a second clock pulse phase for connecting said capacitor to said non-inverting input and to said second terminal;

a third switch operated during the first clock pulse phase and connected in series with said first switch and connected to said first terminal;

a fourth switch operated during the second clock pulse phase and connected between one end of said capacitor and said reference potential;

a fifth switch operated during the first clock pulse phase and connected between said reference potential and the reference node of an exterior network connected to the three-pole switch; and a sixth switch operated during the second clock pulse phase and connected between the output of said operational amplifier and the reference made of said exterior network.

* * * * *